(12) United States Patent
Ilyanok

(10) Patent No.: US 7,193,261 B2
(45) Date of Patent: *Mar. 20, 2007

(54) QUANTUM SUPERCAPACITOR

(76) Inventor: Alexandr Mikhailovich Ilyanok, Zhukovsky Street, 10-1-72, Minsk 220007 (BY)

( * ) Notice: Subject to any disclaimer, the term of this patent is extended or adjusted under 35 U.S.C. 154(b) by 163 days.

This patent is subject to a terminal disclaimer.

(21) Appl. No.: 10/482,350

(22) PCT Filed: Jul. 1, 2002

(86) PCT No.: PCT/EA02/00006

§ 371 (c)(1),
(2), (4) Date: Aug. 11, 2004

(87) PCT Pub. No.: WO03/003466

PCT Pub. Date: Jan. 9, 2003

(65) Prior Publication Data

US 2006/0097302 A1    May 11, 2006

(30) Foreign Application Priority Data

Jun. 29, 2001  (RU) .............................. 200100846

(51) Int. Cl.
*H01L 29/76* (2006.01)
(52) U.S. Cl. .................... 257/301; 257/4; 257/298; 977/773
(58) Field of Classification Search ............... 257/301, 257/4, 298; 977/773
See application file for complete search history.

(56) References Cited

U.S. PATENT DOCUMENTS

| | | | |
|---|---|---|---|
| 4,697,224 A | 9/1987 | Watanabe et al. | |
| 5,018,180 A | 5/1991 | Shoulders | |
| 5,300,272 A | 4/1994 | Simandl et al. | |
| 5,389,567 A | 2/1995 | Acovic et al. | |
| 5,420,746 A | 5/1995 | Smith | |
| 5,557,497 A | 9/1996 | Ivanov et al. | |
| 5,667,637 A | 9/1997 | Jewell et al. | |
| 5,856,907 A | 1/1999 | Gabbai | |
| 6,180,252 B1 | 1/2001 | Farrell et al. | |
| 6,627,930 B1* | 9/2003 | Fox et al. | 257/295 |
| 2005/0068805 A1* | 3/2005 | Iiyanok | 365/160 |

* cited by examiner

*Primary Examiner*—Andy Huynh
*Assistant Examiner*—Thinh T Nguyen
(74) *Attorney, Agent, or Firm*—Brooks Kushman P.C.

(57) ABSTRACT

A quantum supercapacitor having nanostrucutured material located between electrodes. The material includes clusters with tunnel-transparent gaps. The clusters have sizes within the range of 7.2517 nm$\leq$r$\leq$29.0068 nm, at which the resonant characteristics of the electron are exhibited. The size is determined by the circular radius of the electronic wave according to the formula $r_0 = \hbar/(m_e \alpha^2 c) = 7.2517$ nm (Plank constant $\hbar$, electron mass $m_e$, fine structure constant $\alpha = 1/137,036$, speed of light c). The cluster size is set within the range $r_0 \leq 4r_0$; the width of the tunnel-transparent gap being $\leq r_0 = 7.2517$ nm. The energy in the supercapacitor is stored by means of controlled breakthrough of the material—a dielectric, with subsequent restoring thereof. The energy is stored uniformly along the whole volume of the material due to the resonant coupling of the electrons on the cluster. The maximum stored specific energy stored is 1.66 MJ/kg.

19 Claims, 1 Drawing Sheet

QUANTUM SUPERCAPACITOR

BACKGROUND OF THE INVENTION

1. Field of the Invention

The invention relates to the field of electronics and electrotechnology and can be used in production of capacitors for creation of elements (cells) of memory for integrated microcircuits, in high-Q contours, in decoupling elements, and in reserve power supplies. Such memory cells can be used as sources of current for a mobile communication facility, in energy installation of an electric vehicle, and also for buffer accumulation of electrical energy with high specific density on the order of 1–1.5 MJ/kg.

2. Background Art

Electrical capacitors having a large specific capacity on the base of solid dielectrics are known. For example the capacitor on $BaTiO_3$ dielectrics have large permittivity $\in >1000$ and specific capacity of about 0.3 F/cm$^3$. However, in the majority of the power applications such specific capacity is not enough. To increase specific capacity different methods are applied. A most effective method is nanostructuring of dielectrics such as $BaTiO_3$ by creation of nanosize clusters with a shell [1], or creation of thin nanosize films with metal doping [2]. With the help of such an approach, it is possible to increase permittivity up to $\in =10^5-10^6$ and to achieve specific capacity on the order of 100–1000 F/cm$^3$. In result, it is possible to receive specific energy reserved in the capacitor of on the order of 2–20 MJ/kg. The specific energy reserved in such capacitors considerably exceeds one, reserved in lead (0.08 MJ/kg) and nickel (0.15 MJ/kg) electrochemical accumulators and is commensurable with specific energy, reserved in best lithium accumulators (0.5MJ/kg) [3].

Obviously, the advantage of capacitors compared to electrochemical accumulators is rapid accumulation of energy and unlimited quantity of the recharging cycles. However, in capacitors made in accordance with the foregoing patents the barium titanate with a high degree metals doping is used. It results in the transformation of dielectric to the semiconductor. In result, there is large leakage current that results in rapid loss of the stored energy. Hence, the application of such capacitors for long-term storage of energy is not effective. Besides, as the reserved energy increases greater than 2 MJ/kg the film $BaTiO_3$ cracks. Thus, it is impossible to achieve a limiting value of 20 MJ/kg practically for a while yet.

Another type of capacitors with high specific capacity is known. It is the so-called supercapacitors which have a double electrical layer formed between liquid electrolyte and electrode. To increase the specific capacity the electrode is made from various materials with a large specific surface, for example [4], the patent [5]. Specific capacity of such capacitors is on the order of 2–46 F/cm3 at the maximal specific energy, reserved by them up to 0.045 MJ/kg. The limiting reserved energy in such capacitors is determined by potential of electrolyte dissociation which does not exceed 2–3 V. Such capacitors are quickly charged and have unlimited recharging cycle. However, the electrolyte used makes it unserviceable and also increase leakage current that reduces energy storage time. Besides, the low specific reserved energy does not allow replacing by it the electrochemical accumulators in practically important cases.

In the listed above solid-state and liquid accumulators the mechanism of carry of ions is used. For example, in $BaTiO_3$, ions are moved together relatively to a crystal lattice, and in liquid electrolyte the carry of ions is carried out due to mechanical moving of ions relative to a surface of electrodes. Such process of movement of heavy ions limits the high-speed characteristics. Therefore, such capacitors cannot be applied in elements of memory of super high speed integrated circuits.

SUMMARY OF THE INVENTION

The essence of the invention is the improvement of the power characteristics of capacitors, their operating speed, creation of the capacitor having small leakage current and long storage time of a charge, and also unlimited number of recharging cycles.

It is possible to solve this task by transition from a storage of a charge as ions to a storage of a charge as electrons. However, known dielectrics, using the effect of displacement of electrons relative to ions, have $\in \leq 100$. In essence, in solid-state dielectrics the accumulation of energy occurs due to the work of turn of a polarization vector in a unit of dielectric volume of electronic or ionic type. Thus, maximal reserved specific energy is determined from the known equation $$W_e = \tfrac{1}{2} \in \in_0 E^2 = U^2 C/2 = qU/2. \qquad (1)$$

Where $\in_0$—vacuum permittivity, E—electric strength in the capacitor, U—voltage in the capacitor, C—capacity of the capacitor, q—charge on the capacitor. As it is shown by (1), it is possible to increase specific energy by two ways: either the increase of $\in$, or, more effectively, the increase of E. However, the increase of strength of a field E results in irreversible disruption of the dielectric [6]. Disruption in solid dielectrics occurs due to electron emission in the dielectric from capacitor plates. The electrons, emitting in the dielectric, under action of an accelerating electrical field, move from the cathode to the anode. On the way they have multitudinous impacts that result in the formation of an electron avalanche, i.e., disruption. As a result of the ionization by collision the positive ions are created. They remain in a trace of the avalanche and form a positive charge. Besides, there is an opportunity of activization of electrons, taking place in the material of the dielectric which also participate in avalanche disruption. Furthermore, with the increase of dielectric thickness there is a so-called bulk effect, i.e., disruptive voltage of the dielectric is reduced steeply, that results in reduction of accumulated specific energy. The avalanche disruption results in the destruction of the material of the dielectric and the formation of a defective channel which is not restored. In result, the capacitor fails.

At present there are many theories of the mechanism of dielectric disruption [6]. But all of them solve separate partial tasks only by approached ways.

The essence of the invention is the creation of a new mechanism of accumulation of energy in all volume solid dielectrics due to the management of the disruption mechanism and the regeneration of working parameters of the dielectric material.

In the disclosed invention it is proposed to use for the simultaneous increase of $\in$ and E the new mechanism of electron movement in dielectric and semiconductors in view of the spatial structure of an electron wave, published in the PCT Application [7].

In this work is shown, that the electron form—its charging wave—changes in dependence on speed of electron movement and structure of a material in which it goes. In the simplest cases, the electron form can be presented as charged tore, rotating about its axis. It is possible to present an electron in a minimum of the energy as a thin uniformly charged ring with a charge e, rotating about an axis with speed $\alpha^2 c$, $\alpha$—constant of fine structure, and c—speed of light. The electrostatic field of such an electron is concentrated in its plane, i.e., it represents the transverse charged wave. In result, the cross-section of interaction between such electrons is minimal, and it is possible to observe such electron state in vacuum at its movement with speed relatively laboratory system of coordinates, less $\alpha^2 c$ or at its movement in superconductors [7]. The diameter of such electron is determined from the experiment of electron "tunneling" through a vacuum interval. It is experimentally established that the tunnel effect disappears at distance between electrodes about 8 nm [8, chapter 9.4], [9, chapter 3]. This extremely important experimental fact is constantly ignored.

Consider that the radius of such a ring electron is connected with fundamental constants [7]:

$$r_0 = \hbar/(m_e \alpha^2 c) = 7.2517 \text{ nm}. \quad (2)$$

The proposed theoretical model of a ring electron allows a new approach in describing most of time-varying and non-linear processes occurring in condensed matter with new position.

In certain materials it is possible to induce a condition of formation of a ring electron by means of an external action and/or by nanostructuring of a matter. By that, the resonance conditions for operating of quantum supercapacitors are provided which allow its functioning at normal and higher temperatures.

Due to reduction of interaction cross-section with ions of a dielectric crystal lattice it is possible to increase working temperature of the quantum supercapacitor up to a value $$T_e = m_e \alpha^3 c^2 / 2k = 1151.86 \text{ K } (878.71° \text{ C.}). \quad (3)$$

The transition potential of electron through a barrier $U_e = 0.09928$ V corresponds to this temperature. At coupling of electrons with the unidirectional spins, its energy grows twice.

If electrons with oppositely directed spins couple, the coupling energy, due to the spin turning in space on $\pi$, decreases up to value $$T_\Pi = T_e/\pi = 366.65 \text{ K } (93.5° \text{ C.}). \quad (4)$$

Temperatures $T_e$ and $T_\Pi$ are critical working temperatures depending on the given mode of operations of quantum supercapacitors.

The frequency of rotation of an electronic ring will determine the limiting working frequency of the quantum supercapacitors $$f_e = \alpha^2 c / 2\pi r_0 = m_e (\alpha^2 c)^2 / h = 3.5037 \times 10^{11} \text{ Hz}. \quad (5)$$

Extreme achievable density of a current in the quantum supercapacitor is $$j_e = e f_e / \pi r_0^2 = 4\pi e m_e^3 \alpha^8 c^4 / h^3 = 3.4 \times 10^4 \text{ A/cm}^2. \quad (6)$$

Maximum allowed field strength at which disruption occurs in the quantum supercapacitor is $$E_e = U_e / r_0 = m_e^2 \alpha^5 c^3 / 2e\hbar = 1.37 \times 10^5 \text{ V/cm} \quad (7)$$

The resistance of a material determines the leakage current of the capacitor, i.e., the storage time of energy. The resistance can be calculated per one cluster as follows $$R_e = h/2e^2 \alpha = 1.768 \times 10^6 \, \Omega \quad (8)$$

At series connection of such clusters, the resistance grows directly proportionally and in essence does not affect on the leakage currents of the capacitor if the intensity of a field is less than $E_e$ and the working temperature is less than $T_e$.

To calculate power parameters of the capacitor cluster will be considered to be centrally symmetrical and have together with tunneling transparent shells the diameter of $2.175 \times 10^{-6}$ cm. As such, $2.1 \times 10^{11}$ such clusters are present on 1 cm$^2$ of material. The steadiest state of cluster will be in the case when there are two electrons in it. Then 1 cm3 of a material can store the charge of $2.42 \times 10^{-2}$ C. If a working voltage on capacitor plates is $1.37 \times 10^5$ V, in compliance with the formula (1) the specific reserved energy in the capacitor is $W_e = 1.66 \times 10^3$ J/cm$^3$. If a hollow sphere is used, the specific density of a material at any shell will not exceed 1 g/cm$^3$. Hence, the specific energy reserved in 1 kg of a material will be not less than 1.66 MJ/kg. This value corresponds to $\in = 2 \times 10^6$.

On the base of this model it is possible to develop the absolutely new principle of work and ways of functioning of capacitors with solid dielectric according to the given below formula and description of the invention. In principle, it is possible to create any defect in a solid material which will be a certain resonator for a ring wave with radius-$r_o$ and effective capacitor $Q - 1/\alpha$. The high capacitor Q of the resonator determines the high working temperature of the capacitor.

The essence of the invention is as follows.

In accordance with one embodiment of the invention the quantum supercapacitor contains at least two electrodes, the interval between which is filled by nanostructured materials, consisting of, at least, one cluster and a tunnel-transparent layer. It is characterised by that the cluster has at least one distinctive cross size, determined within an interval $$7.2517 \text{ m} \leq r \leq 29.0068 \text{ nm}.$$

The thickness of the tunnel-transparent gap is not more than 7.2517 nm, and the spacing between the electrodes is more than 7.2517 nm.

In the invention limit values are determined from the formula $$r = a * r_0,$$

where $r_0$ is determined as the ring radius of an electron wave according to the formula $$r_0 = \hbar/(m_e \alpha^2 c) = 7.2517 \text{ nm},$$

where $\hbar$—Plank contstant, $m_e$—electron mass, $\alpha = 1/137,036$—constant of fine structure, c—speed of light, and a—factor determined within the range $1 \leq a \leq 4$.

In the invention, the clusters could be made from material selected from the group consisting of the substances—semiconductor, conductor, superconductor, high molecular organic substance or their combination.

Also the clusters could be made in the form of a cavity having a shell from a tunnel-transparent layer consisting of the semiconductor or dielectric.

In one variant, the clusters have centrally symmetric form. In another variant, the clusters are extended and have a distinguished cross-sectional size determined within the interval $$14.5034 \text{ nm} \leq r \leq 29.0068 \text{ nm}.$$

Extending clusters can be placed along an axis and have a regular structure with the period determined in intervals $$7.2517 \text{ nm} \leq r \leq 29.0068 \text{ nm}.$$

According to another embodiment of the invention, a set of clusters can be regularly located at least in one layer, and the intervals between clusters is tunnel-transparent and do not exceed 7.2517 nm ($r_0$).

Besides a set of clusters with tunnel-transparent gaps can be regularly located as layers, at least, in one of layers the parameters of the clusters can differ from the parameters of the clusters in the next layers. The intervals between the clusters are tunnel-transparent and do not exceed 7.2517 nm ($r_0$).

Also a set of clusters made in the form of a cavity having a shell made from a tunnel-transparent layer can contact at least in two points of a cavity with the next clusters. Then they form the material similar to foam with open pores. The shell is made from either semiconductor, dielectric, or high molecular organic substance, and the pores can be filled with either gas, semiconductor, or dielectric, with the properties differing from the properties of the material of the shell.

The mode operation of the quantum supercapacitor is characterized by that the enclosed electrical field in a working range of strength for work of the capacitor in a storage mode should not exceed $1.37*10^5$ V/cm. It is determined from the condition $E \leq 3E_{max}$, where $$E_{max} = m_e^2 \alpha^5 c^3 / 2e\hbar = 1.37*10^5 \text{ V/cm},$$

and the intensity of a field in a charge mode should not exceed $4.11*10^5$ V/cm, accordingly from the condition $E \leq 3E_{max}$.

Besides for reliable work of the quantum supercapacitor the limiting density of a current in it should be limited by the value $1.02*10^5$ A/cm², determined from the formula $$j_e = 12\pi e m_e^3 \alpha^8 c^4 / \hbar^3 = 1.02*10^5 \text{ A/cm}^2.$$

The way of work of the capacitor in a discharge mode is characterized also by that the source of a current with sign, which is opposite to sign of a field of the capacitor in a charge mode, is connected to the capacitor through loading. It is necessary for completely taking off charges on all depth of the capacitor. Otherwise, the capacitor is unloaded partially.

In the capacitors the limiting working frequency of management of the quantum supercapacitor achieves the value $$f_e^0 = f_e/2 = m_e(\alpha^2 c)^2 / 2h = 1.752*10^{11} \text{ Hz}.$$

That is especially important to increase the capacitor processing speed used in memory. The examples of realization of these devices are given below and are represented on the drawings.

BRIEF DESCRIPTION OF THE DRAWINGS

The list of figures specified on the drawings
FIG. 1. Nanoelement of quantum supercapacitors.

DETAILED DESCRIPTION OF THE PREFERRED EMBODIMENTS

Figure 1:
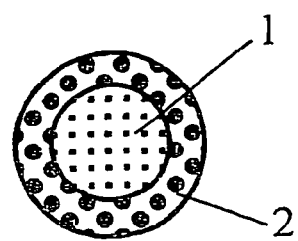

On FIG. 1 the typical nanoelement of the quantum supercapacitors is represented with a central-symmetric cluster 1 and a tunnel-transparent shell 2. Clusters can be axis-symmetric. It is important, that the resonant conditions of formation in them of a ring wave of electron are carried out.

Figure 2:
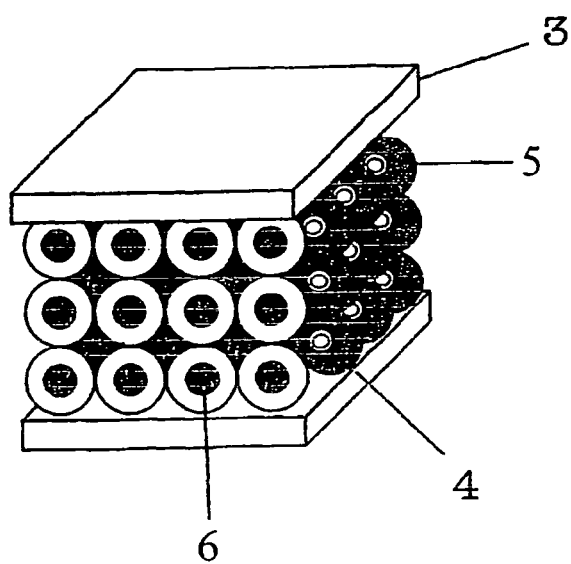
FIG. 2. Quantum supercapacitor with dielectric comprising central-symmetric clusters.

On FIG. 2 one of the variants of the quantum supercapacitors is represented agrees to the present invention with conducting electrodes 3, 4; tunnel-transparent shell of cluster 5; and central-symmetric cavity in cluster 6. Cluster cavity 6 can be filled with an appropriate material or gas for creation of the formation conditions of the ring resonant electron. Tunnel-transparent shell 5 divides clusters among themselves and creates conditions of motion of electrons as a homogeneous wave from the cathode to the anode. The anode and cathode position can be interchanged, i.e., the capacitor is not polar.

Figure 3:
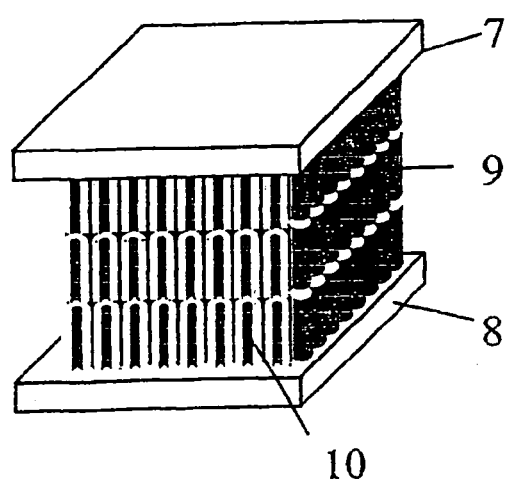
FIG. 3 Quantum supercapacitor with dielectric comprising axis-symmetric clusters.

On FIG. 3 another variant of the quantum superccapacitor is represented with conducting electrodes 7, 8; tunnel-transparent shell of cluster 9; and axis symmetric cavity in cluster 10. Cluster cavity 10 can be filled with the appropriate material or gas for creation of conditions of ring resonant electron formation. Tunnel-transparent shell 9 divides cluster among themselves and creates conditions of motion of electrons as a homogeneous wave from the cathode to the anode. The anode and cathode position can be interchanged, i.e., the capacitor is not polar.

Each layer the capacitor shown in FIGS. 2 and 3 should be homogeneous. At the same time, the layers can differ from each other by the cluster sizes or material.

According to the further improvement, the capacitor is characterized also by that the capacitor electrodes are made from conducting materials with various electrical properties. In such case, the various works of an electron output from the electrodes allow to change conditions of a charge and discharge of the capacitor. In this case discharge conditions can be bipolar as unipolar.

EMBODIMENT OF THE INVENTION

The disclosed invention provides an opportunity of increasing specific density of energy content at simultaneous increase of working temperatures of capacitors and reduction of leakage currents, that increases a storage time of energy in the capacitor. These parameters determine a commercial realizability of capacitors. However, the problem is, whether it is possible to use modern techniques for producing the proposed capacitors and whether the mass-produced devices are economical.

Consider opportunities of technical realization. The creation of the disclosed nanostructured materials for capacitors as clusters, divided tunnel-transparent intervals is quite feasible on modern technological base.

Now in the electrotechnical industry the dielectrics with the nonlinear characteristic are widely used, on the base of which the limiters of input voltage-varistors are created. In these elements have place the discharge proceeds without any destruction of a material, for example in wide-gap semiconductors, designed in the form of ZnO multilayer polycrystalline films. The size of crystallites-clusters in these films is 0.2–15.0 μm. They are divided by $Bi_2O_3$ tunnel-transparent gaps of the thickness 2.0–10.0 nm [10]. Manufacture of varistors is well organized. Based on the manufacture it is possible simply enough to make clusters by the size less than 200 nm, having finished them up to the characteristic size 14.5 nm.

In this case resonant properties of electrons will be shown and the element will get new properties for storing energy.

There are two methods of forming spherical and sphere-like particles [11]. The first method—metal or semiconductor clusters of a diameter up to 37 nm are formed from a gas phase with their further oxidation in the oxygen flow or similar chemicals. Formation of such particles is similar to formation of hail in the Earth atmosphere. The second method is the colloidal method. It is based on cluster precipitation from metal salt solutions followed by chemical coating with corresponding enclosures.

Nanosized hollow spheres of zirconium dioxide are automatically obtained during the process of high-frequency plasma-chemical denitrification; therefore they may be applied to the substrate directly from plasma [12]. Or, for example, 4—15 nm particles result automatically in material $Mo_2N$ [13].

Designing planar vertical nanochannels is based on collective formation methods, e.g. according to electrochemical oxidation Al, Ta, Nb, Hf, etc. The formed channel may be filled with metal or semiconductor by the galvanic technique [14].

The aforementioned examples show that the modern techniques allow production of nanostructured materials for the quantum supercapacitor on the basis of existing technologies.

Besides in microelectronics there are fulfilled ways of creation on silicon gigabite memory. It is possible to apply nanostructured material to increase storage time and reduce the sizes of cells of such memory. It can directly be plated on cells of memory from a gas phase through open windows of a mask. In this case it is possible on the same surface of silicon to receive greater volume of memory or its smaller power consumption.

It is especially important, that it is possible to receive non-volatile memory. Thus the minimally possible cells of memory for the perspective integrated circuits will not exceed the size one cluster with a shell, i.e., about 30 nm.

It is important, that this size is a fundamental limit for the electronic circuits using electrons as carriers. Below than this size it is impossible to create elements of the integrated circuits due to tunnel effects appearing between control lines.

As applied to power engineering for buffer accumulation of a volume energy it is possible to use for creating quantum supercapacitors more simple technology of making of nanostructured material, for example, on the base of creation nanoporous foam. For this purpose, it is possible to finish technology of creation of carbon foam or technology of synthesis of nanoporous silicate glasses [15]. Besides the low-coast method of synthesis of spherical porous particles on sol-gel method will allow also to generate nanostructured material for the capacitor [16].

INFORMATION SOURCES

1. U.S. Pat. No. 5,856,907
2. U.S. Pat. No. 6,180,252
3. Electrochemistry. Past thirty and next thirty years. G. Bluma. M., World, 1982 (In Russian).
4. U.S. Pat. Nos. 4,697,224; 5,557,497
5. Russian Patent 2160940
6. PCT/BY99/00012 "Quantum-Size Electronic Devices and Operating Conditions Thereof" (International Publication Number: WO 00/41247, 13.07.2000)
7. M. Beyer, W. Boeck, K. Moller, W. Zaengl. Hochspannungstechnic. Theoretische und Praktische Grundlagen. Springer-Verlag, 1986.
8. S. M. Sze. Physics of Semiconductor Devices. A Wiley-Interscience Publication John Wiley&Sons. New York. 1981
9. Buzaneva E. V. Microstructures of integral electronics. M. Radio. 1990.
10. Application PCT WO 98/21754, 22.05.1998.
11. Petrov U. I. Cluster and minor particles. M. Nauka. 1986, 368 pp. Dedov N. V. et al., Structural studies of powders on basis of zirconium dioxide produced by HF-plasma-chemical denitration method. Glass and Ceramics. 1991. No. 10, p. 17–19. J. Phys. Chem. 18. No. 15. 1994. P. 4083.
12. Averianov E. E. Anodization manual, M., Mashinostroenie, 1988 U.S. Pat. No. 5,300,272
13. Anal. Sci. 10. No. 5. 1994. P. 737.

What is claimed is:

1. A quantum supercapacitor comprising at least two electrodes, the interval between which is filled by nanostructured materials, including at least one cluster with a tunnel-transparent gap, wherein each cluster has a characteristic size determined in the range 7.2517 nm $\leq r \leq 29.0068$ nm, the thickness of each tunnel-transparent gap being less than or equal to 7.2517 nm, the spacing between the electrodes being more than 7.2517 nm.

2. The quantum supercapacitor according to claim 1, wherein the clusters are made of material having a substance selected from the group of semiconductor, conductor, superconductor, high molecular organic substance or their combination.

3. The quantum supercapacitor according to claim 1, wherein the clusters are made in the form of a cavity having a shell made of a tunnel-transparent layer, the shell being either a semiconductor or a dielectric.

4. The quantum supercapacitor according to claim 1, wherein each cluster has a centrally symmetric form.

5. The quantum supercapacitor according to claim 1, wherein each cluster is extended and has a characteristic size determined within the range 14.5034 nm $\leq r \leq 29.0068$ nm.

6. The quantum supercapacitor according to claim 4, wherein each cluster is extended along an axis and has a regular structure with a period determined within the range 7.2517 nm $\leq r \leq 29.0068$ nm.

7. The quantum supercapacitor according to claim 1, wherein a set of the clusters are located at least in one layer, and the spacings between adjacent clusters are tunnel-transparent less than or equal to 7.2517 nm.

8. The quantum supercapacitor according to claim 1, wherein a set of the clusters with tunnel-transparent gaps are located as layers, at least in one of the layers the parameters of the clusters differ from the parameters of the clusters in other layers, the spacings between the adjacent clusters are tunnel-transparent less than or equal to 7.2517 nm.

9. The quantum supercapacitor according to claim 1, wherein a set of the clusters are made in the form of a cavity having a shell made of a tunnel-transparent layer, contact at least in two points of a cavity with the adjacent clusters, forming the material similar to foam with open pores, each shell is made from either semiconductor, dielectric, or high molecular organic substance, and pores of which can be filled either with gas, semiconductor, or dielectric, with properties differing from properties of material of the shell.

10. The quantum supercapacitor according to claim 1 wherein the electrodes are made from conducting materials with various electrical properties.

11. The quantum supercapacitor according to claim 1, wherein each cluster has an axis symmetric form.

12. The quantum supercapacitor according to claim 2 wherein the electrodes are made from conducting materials with various electrical properties.

13. The quantum supercapacitor according to claim 3 wherein the electrodes are made from conducting materials with various electrical properties.

14. The quantum supercapacitor according to claim 4 wherein the electrodes are made from conducting materials with various electrical properties.

15. The quantum supercapacitor according to claim 5 wherein the electrodes are made from conducting materials with various electrical properties.

16. The quantum supercapacitor according to claim 6 wherein the electrodes are made from conducting materials with various electrical properties.

17. The quantum supercapacitor according to claim 7 wherein the electrodes are made from conducting materials with various electrical properties.

18. The quantum supercapacitor according to claim 8 wherein the electrodes are made from conducting materials with various electrical properties.

19. The quantum supercapacitor according to claim 9 wherein the electrodes are made from conducting materials with various electrical properties.

* * * * *

UNITED STATES PATENT AND TRADEMARK OFFICE
CERTIFICATE OF CORRECTION

PATENT NO. : 7,193,261 B2 Page 1 of 1
APPLICATION NO. : 10/482350
DATED : March 20, 2007
INVENTOR(S) : Alexandr Mikhailovich Ilyanok It is certified that error appears in the above-identified patent and that said Letters Patent is hereby corrected as shown below:

Column 8, Line 11, Claim 1:

After "gap," insert -- between adjacent clusters --.

Signed and Sealed this

Twenty-sixth Day of June, 2007

JON W. DUDAS
*Director of the United States Patent and Trademark Office*